March 16, 1954 O. G. VILLARD, JR 2,672,529

ADJUSTABLE FREQUENCY SELECTIVE APPARATUS

Filed March 7, 1951 2 Sheets-Sheet 1

INVENTOR
OSWALD G. VILLARD, JR.
BY
Thomas M. Ferrill, Jr.
ATTORNEY

March 16, 1954 O. G. VILLARD, JR 2,672,529

ADJUSTABLE FREQUENCY SELECTIVE APPARATUS

Filed March 7, 1951 2 Sheets-Sheet 2

INVENTOR
OSWALD G. VILLARD, JR.
BY
Thomas M. Ferrill, Jr.
ATTORNEY

Patented Mar. 16, 1954 2,672,529

UNITED STATES PATENT OFFICE 2,672,529

ADJUSTABLE FREQUENCY SELECTIVE APPARATUS

Oswald G. Villard, Jr., Palo Alto, Calif., assignor to The Board of Trustees of the Leland Stanford Junior University, Stanford University, Calif.

Application March 7, 1951, Serial No. 214,405

12 Claims. (Cl. 179—171)

The present invention relates to frequency-selective circuits, and is particularly concerned with a circuit arrangement for variable band width and variable selectivity as well as variable response frequency.

An object of this invention is to provide improved frequency selective circuit apparatus, for flexibility as to band width and selectivity, as well as adjustability over a wide range of response frequencies.

It is a further object to provide selective circuit apparatus of very high stability.

It is yet a further object to provide frequency-selective apparatus free from reliance upon inductance-capacitance resonant circuits, and capable of adjustability as to band width without change in the frequency of maximum response.

Yet another object is to provide selective circuit apparatus avoiding reliance upon inductance-capacitance resonant circuits, and capable of tuning over a relatively wide range of frequencies, with minimum change of response frequency band width.

Selective amplifier systems have heretofore been constructed wherein a wide-band amplifier was provided with a feed-back circuit including a plurality of cascade phase shifter stages. The phase shifters were each provided with a phase inverter and a series resistance-capacitance output circuit, so arranged as to provide an output voltage of substantially constant amplitude and of phase variable over a range of substantially 180 degrees, from a condition of substantial cophasality with the individual phase shifter input voltage to a condition of substantial phase opposition therewith.

The phase shifters were designed for equal phase shifts, and either the capacitor elements or the resistor elements were ganged together for wide range variation, with equality of the varied elements in the respective stages being maintained. These phase shifters could be so coupled to the output and input circuits of the amplifier as to yield positive feedback (regeneration) when their shifts were 90° each and their total phase shift accordingly 180°. With this connection, the gain of the amplifier was greatly enhanced at the frequency at which the phase shift of each of the two shifters was 90°, and hence the system was usable as a highly selective "tuned" amplifier. If sufficient feedback and gain were provided, the system operated as a stable oscillator, generating sinusoidal output voltage at the frequency at which the phase shifters each yield 90° phase shift.

The same phase shift stages may also be connected by switching in parallel with the input of an amplifier. The output of the amplifier and the output of the phase shifters may then be combined in such a way that at the frequency at which the phase shifters individually yield a 90° phase shift, the two outputs cancel, thereby giving zero net transmission.

The features of the above-described system are set forth in detail in a paper by the present inventor entitled "Tunable A-F Amplifier," in electronics, July, 1949, pages 77-79, and described and claimed in application Serial No. 153,065, filed in 1950 by the present inventor. A closely related system, wherein the feedback circuit with tandem 90° phase shifters is employed to generate oscillations, is described and claimed in U. S. Patent No. 2,452,586 to Rawley D. McCoy.

According to the present invention, an improved selective amplifier system is made by providing dual feedback circuits having their output components supplied in opposition to each other in the amplifier input circuit; and in one of these feedback circuits, the plural phase shifter stages are connected in tandem and are arranged for differential control of their phase shift characteristics. With this arrangement, the user is enabled to broaden the response curve of the system as desired, and withal, to preserve very high stability of the system, with particular advantage in the use thereof for selective acceptance of a desired frequency or frequencies in a predetermined band.

In the accompanying drawings.

Figure 1:
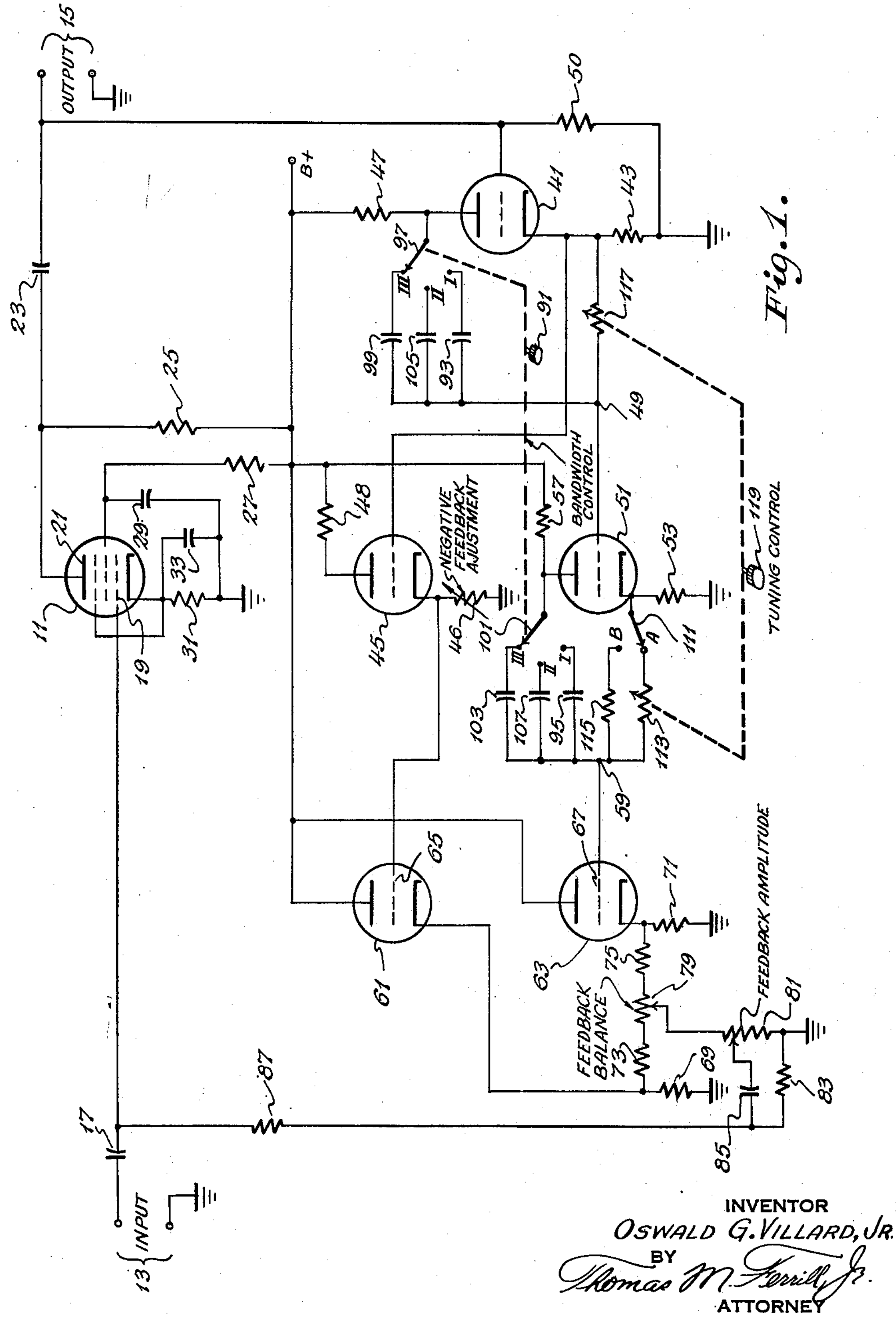
Fig. 1 is a circuit diagram of a preferred embodiment of the present invention.

Referring now to Fig. 1, a broad-band amplifier 11 is provided with input terminals 13 and output terminals 15. This amplifier comprises an input coupling capacitor 17 connected between the input terminals and the grid 19 of the pentode tube, and an output coupling capacitor 23 connected between the anode 21 of the tube 11 and the output terminals 15.

Anode and screen grid supply resistors 25 and 27 are connected to the amplifier, the screen grid being by-passed to ground through the capacitor 29, and a cathode bias circuit including a resistor 31 and capacitor 33 are included in the amplifier stage.

The circuit constants associated with the pentode tube are selected to provide substantially flat frequency response of this stage over a very wide band of frequencies.

As will become apparent from a consideration of the system of Fig. 1, the use of a single amplifier stage 11, and the selection of a pentode therefor, are matters merely of design; a plurality of stages may be provided, and triodes or other amplifier elements may be employed if desired.

A dual-channel feedback system is provided between the output terminals 15 and the input circuit 13, 17 of the amplifier 11. One feedback channel employs tube 41 operating as a cathode follower stage with cathode load resistor 43, followed by tube 45, connected as a further cathode follower stage.

The other channel employs tube 41 with its cathode resistor 43 and a plate load resistor 47, being equal, providing phase inverter operation of this tube with balanced output between cathode and anode. Between the cathode and anode of stage 41 is connected a resistance-capacitance circuit for providing an output voltage at terminal 49 whose phase is dependent upon frequency and upon the resistance and capacitance values in the series circuit between the cathode and anode of tube 41.

This second channel includes a further phase shifter stage 51 which is generally similar in its circuit arrangement and operation to phase shifter stage 41. Phase shifter 51 is provided with a cathode load resistor 53 and an anode load resistor 57, and with a series resistance-capacitance circuit between cathode and anode, the output terminal 59 of which provides a phase shifter output version of the voltage supplied to the grid of stage 51.

A dual-triode electronic mixer or combining stage 61, 63 is provided, with one triode grid 65 supplied by the output of cathode follower stage 45, and the other triode grid 67 supplied by the second-channel output voltage version developed at terminal 59. The combining circuit 61, 63 is provided with a cathode load resistance output network including resistors 69, 71, 73, 75 and 79, the last-mentioned resistor being arranged as a potentiometer-type element for feedback balance adjustment. The output voltage provided at the variable tap of potentiometer element 79 is supplied to a feedback amplitude control circuit including potentiometer 81, resistor 83 and coupling capacitor 85, which is coupled through resistor 87 to the input circuit of amplifier 11.

Two selector switches are provided in the resistance-capacitance time constant control circuits of stages 41 and 51. The first is a ganged selector switch 91 including two three-position switch sections. At position I, the arms of this switch are connected to equal capacitors 93 and 95 in the respective phase shifter output circuits. When this switch is set to position III, the arms are connected to capacitors of greatly contrasting values, as for example, arm 97 is connected to a capacitor 99 having a capacitance value ten times as high as that of capacitor 93, whereas arm 101 is connected to a capacitor 103 having $\frac{1}{10}$ the capacitance value of capacitor 95. At the intermediate position II, these arms contact terminals connected to capacitors 105, 107, respectively of intermediate values, capacitor 105 being, for example, of three times the capacitance value of capacitor 93 and capacitor 107 being of ⅓ the capacitance value of capacitor 95.

The second circuit selector feature includes a single-pole, double-throw switch 111 which, in position A, connects variable resistor section 113 between the cathode of tube 51 and terminal 59. When the arm of switch 111 is transferred to contact terminal B, this switch removes variable resistor section 113 from the circuit, and substitutes a fixed resistor 115 of relatively low resistance value, between terminal 59 and the cathode of tube 51.

The variable resistor element 117 connected between the cathode of tube 41 and terminal 49 is a variable resistor similar to resistor element 113 in all respects, and ganged therewith as a dual potentiometer, as indicated by the dotted line connections of the frequency control knob 119.

Since the grid of tube 51 is connected directly to terminal 49, with a direct-current path through variable resistor element 117 to the cathode of tube 41, which is at a slight positive potential above ground, and since it is advisable that the grid of tube 51 be at negative bias potential with respect to the cathode thereof, the cathode load resistor 53 is preferably of a value appreciably higher than the resistance of cathode resistor 43, e. g. twice the resistance of resistor 43. The resistance values of elements 47 and 43 are equal, and likewise the resistance values of elements 57 and 53 are equal.

Preferably, triodes 45 and 51 are the respective sections of a dual triode tube and likewise triodes 61 and 63 are the respective sections of a dual triode tube.

These dual triode tubes may be of the 12AU7 type, and suitable tube types for amplifier 11 and phase inverter stage 41 are the 6AU6 type tube and the 6C4 type tube, respectively.

Typical resistance and capacitance values for satisfactory operation of the above described system are tabulated below:

*Capacitors*

| | Microfarad |
|---|---|
| 17 | 0.1 |
| 23 | 0.1 |
| 29 | 0.1 |
| 33 | 50. |
| 85 | 0.1 |
| 93 | 0.002 |
| 95 | 0.002 |
| 99 | 0.02 |
| 103 | 0.0002 |
| 105 | 0.006 |
| 107 | 0.00066 |

*Resistors*

| | |
|---|---|
| 25 | 0.22 megohm. |
| 27 | 0.6 megohm. |
| 31 | 1500 ohms. |
| 43 | 1000 ohms. |
| 46 | 0–5000 ohms, variable. |
| 47 | 1000 ohms. |
| 48 | 2000 ohms. |
| 50 | 1 megohm. |
| 53 | 2000 ohms. |
| 57 | 2000 ohms. |
| 69 | 5000 ohms. |
| 71 | 5000 ohms. |
| 73 | 3000 ohms. |
| 75 | 3000 ohms. |
| 79 | 1000 ohm potentiometer. |
| 81 | 10,000 ohm potentiometer. |
| 83 | 0.1 megohm. |
| 87 | 50,000 ohms. |
| 115 | 15,000 ohms. |
| 113, 117 | 0–500,000 ohms, each section. |

The first feedback channel, comprising the cathode output circuit of tube 41 and cathode follower stage 45, supplies its output to the input circuit of tube 61. Through the mixer 61, 63, this tends to produce a feedback voltage at the grid 19 of amplifier 11 which is in phase with the amplifier output voltage supplied to terminals 15. Since amplifier 11 employs an anode output circuit, its output voltage is 180° out of phase with its input voltage, and accordingly, the above-mentioned feedback voltage supplied by tubes 45 and 61 is an inverse feedback voltage for amplifier 11.

Assuming that switch 111 is set to position A and switch 91 is set to position I, then for a desired frequency of the input voltage of amplifier 11, the "tuning" control 119 may be adjusted to set the variable resistors 117 and 113 for resistance values equal to the impedance magnitude of capacitors 93 and 95 at that selected frequency. For this setting of control 119, each of the cascade-connected phase shifters involving tubes 41 and 51 provides 90° output phase shift, and hence, the output voltage provided between terminal 59 and ground is shifted by 180°—the sum of the phase shifts of the cascade-connected phase shifter stages with respect to the grid voltage of stage 41.

This output voltage, which is supplied to the grid 67 of tube 63, is directly in phase opposition to the cathode output voltage of stage 45, and the voltage component produced across resistor 81 due to the signal at grid 67 is directly in opposition to the voltage component which tubes 45 and 61 tend to produce through the action of tube 61, this latter voltage being a direct positive feedback or regenerative fedback voltage for the input circuit of amplifier 11.

In the use of this system, variable cathode resistor 46 and feedback balance control resistor 79 are adjusted to provide equality of the feedback voltage components produced in resistor 81, so that under the aforementioned conditions of 180° phase shift between the grid of tube 41 and terminal 59 of phase shifter stage 51, the respective output components in resistor 81 are cancelled out, and hence no net feedback is provided to the grid circuit of amplifier 11.

For other frequencies, the phase shifts at terminals 49 and 59 are appreciably greater than 90° and 180°, respectively, or appreciably lower than 90° and 180°, respectively, depending upon the direction of frequency variation from the selected frequency. Under these conditions, the output components in resistor 81 are not cancelled out, but instead, a net feedback is realized in the grid circuit of amplifier 11, substantially in phase opposition to the input voltage supplied to terminals 13 thereof, so that the effective over-all gain of the system of Fig. 1 for such frequencies is materially reduced.

Each of the cascade-connected phase inverter stages provides substantially constant amplifier output voltage, so that the realization of zero net output voltage across resistor 81 is entirely a matter of phase relationships and not of reduction of amplitude of the current variations through combining circuit tube 63, when the frequency departs from the selected frequency.

Now, the response band width of the system with the aforementioned connections and adjustments is relatively narrow. It is definitely advantageous to have such sharpness of selectivity available, but it is often desirable to be able to broaden the responsiveness of the amplifier system.

For this purpose, at a given operating frequency for which, as described before, the impedance magnitudes of elements 113 and 117 are equal to the impedance magnitudes of elements 95 and 93, respectively, the operator may reset switch 91, 97, 101 to position II. With this resetting of this switch, capacitor 93 is replaced in the anode cicuit of stage 41 by capacitor 105 of substantially three times the capacitance value, whereas capacitor 95 in the anode circuit of tube 51 is replaced by a capacitor 107 of substantially one third of the capacitance value. The phase shift of stage 41, in this case, is made appreciably greater, and the phase shift of stage 51 is made appreciably less, the sum of the phase shifts of these stages nevertheless being retained at 180°. The amplitude of the voltage at terminal 59 remains constant, because each phase shifter supplies an output voltage of amplitude independent of its phase shift. But the rate of change of total phase shift at terminal 59 with respect to the grid voltage of tube 41, as a function of frequency of the ampified input signal, is greatly reduced.

Figure 2:
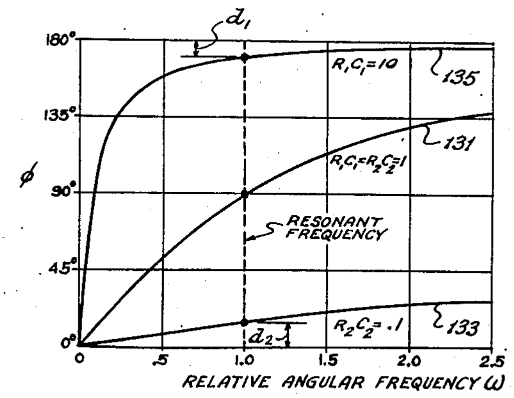
Fig. 2 shows a comparison among the phase shift curves for a phase shifter operating with a 90° phase shift, a phase shifter operating at a very small phase shift, and a phase shifter operating at a very large phase shift, showing the contrast of the slopes of the curves at frequencies in the vicinity of the operating frequency.

This is represented by the curves of Fig. 2, which show the relative steepness of the curve of change of phase with respect to relative changes of frequency in a phase shifter of the resistance-capacitance type set for 90° phase shift, as compared to one phase shifter of the same type set for a very small phase shift, and another phase shifter of the same type set for a very large phase shift. Curve 131 indicates the operation of the 90° phase shift stage, whereas curves 133 and 135 illustrate the operation of stages set for very low phase shift and very high phase shift, respectively.

For even broader band width than provided at setting II, switch 91 may be set to position III, at which position the phase shift of the stage including tube 41 is as represented by curve 135, and the phase shift of the stage including tube 51 is as represented by curve 133.

Figure 3:
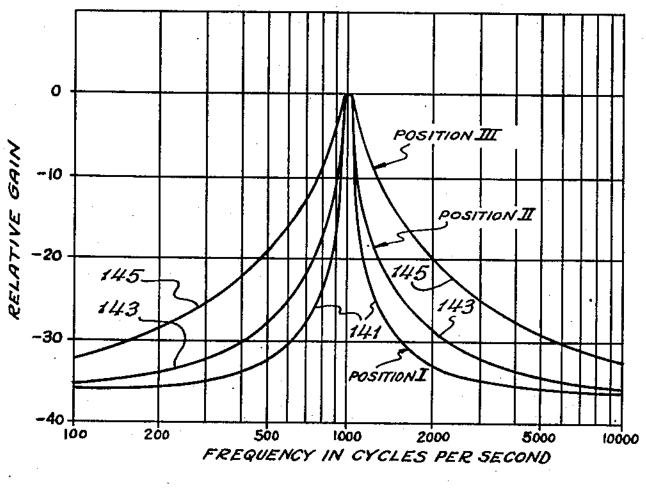
Fig. 3 is a graph showing the various response versus frequency curves available through the operation of switch 91, 97, 101 in Fig. 1.

Fig. 3 illustrates the respective response vs. frequency curves obtainable at 1000 cycles for the three band-width settings of the circuit arrangement of Fig. 1. Curve 141 is the curve of the sharpest frequency response obtainable, illustrating the operation of the system of Fig. 1 with switch 91, 97, 101 set to position I. Curve 143 illustrates the selectivity characteristic for position II, and curve 145 illustrates the broadest response curve, available with switch 91, 97, 101 set for position III.

By virtue of the opposite changes of the capacitance values about the equal values of capacitors 93 and 95 as the geometric mean, the midband frequency or maximum response frequency for a given setting of knob 119 remains constant as switch 91, 97, 101 is changed from one band-width position to another. Thus, even while the system is being used to receive a desired signal, the band width may readily be increased or reduced by the operation of switch 91, without necessitating appreciable readjustment of control 119.

Normally, with switch 91, 97, 101 set to position I for the use of the equal capacitors 93, 95, for maximum sharpness of tuning of the amplifier system, the relative band width of the system remains constant. Accordingly, as the control 119 is rotated in the direction for increasing the resistance values in resistor elements 113 and 117, for decreased response frequency of the system, the actual band width in cycles becomes extremely narrow. This narrowing band width effect may be offset by the use of the system with switch 111 set to position B, leaving the control 119 effective to vary the resistance in only one of the two cascade-connected phase shifter stages. Now, if the resistor 115 has a relatively low resistance value, so that as knob 119 is operated in the direction of increasing resistance, it is also increasing the contrast between the time constants and the resultant phase shifts of the two phase shifter stages, the relative band width is increased as the system is tuned to lower frequencies. This operation is illustrated in the plural curves of Fig. 4, wherein the relative broadening of the relative response curve for a maximum response frequency of 400 cycles is illustrated in comparison to the medium band width response curve for 1000 cycles and the relatively narrow band width for 5000 cycles.

The operation with switch 91 set to position I and switch 111 set to position B is particularly useful where the system of Fig. 1 is employed as a tunable high-selectivity audio amplifier system in the reception of continuous-wave telegraphic signals. For this purpose, the apparatus of Fig. 1 may be connected to the output terminals of the audio amplifier of a superheterodyne receiver which includes an internal I. F. beat frequency oscillator. In such use of the selective apparatus, it is desirable that the operator be able to adjust control 119 to bring the selected frequency of the system of Fig. 1 into register with the frequency of a relatively weak radiotelegraph signal to be received. If the feature of switch 111 and resistor 115 were not available, then as the operator shifted the setting of control 119 for progressively lower frequencies, the absolute band width of the system would be so reduced as to cause excessive ringing of the radiotelegraph signals, or to render them unintelligible.

Figure 4:
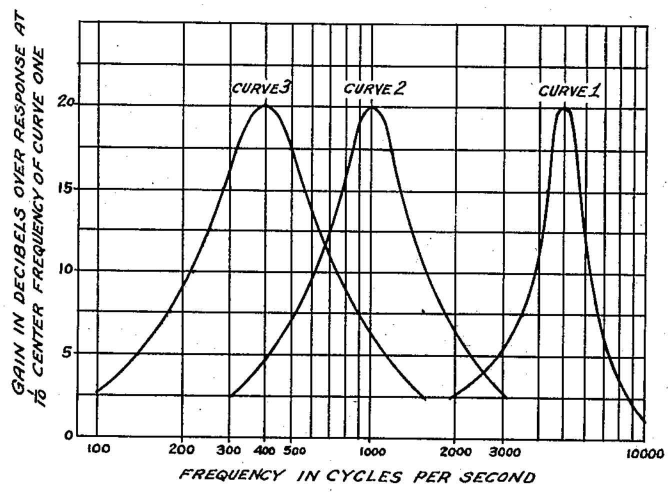
Fig. 4 is a series of response graphs showing the extent to which the variation of absolute band width with frequency of tuning is reduced by reliance upon single-stage phase shift adjustments in the apparatus of Fig. 1, switch 111 being set to position B.

As is apparent from Fig. 4, however, the relative band width is so broadened, as the control 119 is tuned to progressively lower frequencies, as to retain ample absolute band width of the system.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A variable frequency-selective amplifier system comprising a broad-band amplifier having an input circuit for receiving an input signal and an output circuit for delivering an amplified output version thereof, first and second feedback circuits connected between said output circuit and said input circuit, said first feedback circuit comprising means for supplying at said input circuit a substantially fixed-phase first version of the voltage in said output circuit, and said second feedback circuit comprising means including at least two tandem-connected phase shifters of additive phase shifts for supplying at said input circuit a second version of the voltage in said output circuit of equal amplitude to said first version and in phase opposition thereto at a predetermined operating frequency and for providing appreciable phase variation of said second voltage version as a function of variation of frequency of the amplifier-input signal, said second feedback circuit including means for varying the phase shift of one of said phase shifters relative to the other of said phase shifters.

2. A variable frequency-selective amplifier system as defined in claim 1, wherein the substantially fixed-phase first voltage version supplied to said input circuit by said first feedback circuit is in phase opposition to the amplifier input signal.

3. A variable frequency-selective amplifier system comprising a broad-band amplifier having an input circuit for receiving an input signal and an output circuit for delivering an amplified output version thereof; first and second feedback circuits connected between said output circuit and said input circuit, said first feedback circuit comprising means for supplying at said input circuit a substantially fixed-phase first version of the voltage in said output circuit, and said second feedback circuit comprising means including two tandem-connected phase shifters of additive phase shifts for supplying at said input circuit a second version of the voltage in said output circuit of substantially equal amplitude to said first version and in phase opposition thereto at a predetermined operating frequency and for providing appreciable phase variation of said second voltage version as a function of variation of frequency of the amplifier input signal; and means for differentially varying the phase shifts in said two phase shifters.

4. A variable frequency-selective amplifier system as defined in claim 3, wherein said means for differentially varying the phase shifts in the two phase shifters comprises means for advancing the output phase of one of the phase shifters and retarding the output phase of the other and retaining the sum of the phase shifts of said phase shifters equal to 180° at the selected operating frequency.

5. A variable band width frequency-selective amplifier system, comprising a broad-band amplifier having an input circuit for receiving an input signal and an output circuit for delivering an amplified output version thereof; and a feedback circuit connected between said output circuit and said input circuit including two tandem-connected phase shifters of additive phase shifts for supplying at said input circuit a variable-phase version of the voltage in said output circuit, both of said phase shifters being characterized by increasing phase shift for changes of frequency in one sense and by decreasing phase shift for changes of frequency in the opposite sense, means for simultaneously increasing or decreasing the phase shift introduced by the respective phase shifters at a given frequency, and means for differentially varying the phase shift of one of said phase shifters relative to the other of said phase shifters, said last named means acting independently of said first named means whereby the relative phase shift introduced by each of the two phase shifters in tandem is variable independently of the total phase shift of the phase shifters.

6. A variable frequency-selective amplifier system, comprising a broad-band amplifier having an input circuit for receiving an input signal and an output circuit for delivering an amplifier output version thereof; first and second feedback circuits connected between said output circuit and said input circuit, said first feedback circuit comprising means for supplying at said input circuit a substantially fixed-phase first version of the voltage in said output circuit, and said second feedback circuit comprising means including first and second tandem-connected phase shifters of additive phase shifts for supplying at said input circuit a second version of the voltage in said output circuit of substantially equal amplitude to said first version and in phase opposition thereto at a predetermined operating frequency and for providing appreciable phase variation of said second voltage version as a function of variation of frequency of the amplifier input signal.

7. A variable frequency-selective amplifier system as defined in claim 6, wherein each of said phase shifters comprises a phase inverter stage having an anode-cathode load circuit including a resistor element and a capacitor element connected in series, the junction between said elements being the output terminal for phase shifted output voltage.

8. A variable frequency-selective amplifier system as defined in claim 7, wherein the resistor element in the series load circuit of said first phase shifter and the resistor element in the series load circuit of said second phase shifter are ganged variable resistors of substantially equal resistance values.

9. A variable frequency-selective amplifier system as defined in claim 8, wherein said capacitor elements in the series load circuits of said first and second phase shifters are fixed capacitors of substantially equal capacitance values, said variable frequency-selective amplifier system further including means comprising a ganged selector switch having terminals of the respective sections connected to said fixed capacitors, and unequal capacitors connected to further terminals of said respective switch sections for differentially changing the capacitances of said phase shifters to reduce the phase-frequency sensitivity of said phase shifters.

10. A variable frequency-selective amplifier system as defined in claim 8, further including means for selectively substituting fixed resistance of a relatively low resistance value in the series load circuit of one of said phase shifters, whereby the relative band width of said variable frequency-selective amplifier system is broadened as the resistor element in the series load circuit of the other of said phase shifters is adjusted to progressively higher resistance values.

11. A variable frequency-selective amplifier system as defined in claim 6, further including means for simultaneously reducing the phase shift in one of said phase shifters and increasing the phase shift in the other of said phase shifters, by equal extents, at a selected operating frequency.

12. A variable frequency-selective amplifier system as defined in claim 6, further including means for varying the phase-frequency determining element of one of said phase shifters, the phase-frequency elements of the other phase shifter being retained fixed.

OSWALD G. VILLARD, JR.

References Cited in the file of this patent

UNITED STATES PATENTS

| Number | Name | Date |
| --- | --- | --- |
| 2,173,427 | Scott | Sept. 19, 1939 |
| 2,452,586 | McCoy | Nov. 2, 1948 |